(12) United States Patent
Kim et al.

(10) Patent No.: US 12,520,642 B2
(45) Date of Patent: Jan. 6, 2026

(54) DISPLAY DEVICE AND TILED DISPLAY DEVICE INCLUDING THE SAME

(71) Applicant: Samsung Display Co., LTD., Yongin-si (KR)

(72) Inventors: Byoung Yong Kim, Seoul (KR); Jin Wook Jeong, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

(21) Appl. No.: 18/092,523

(22) Filed: Jan. 3, 2023

(65) Prior Publication Data
US 2023/0238498 A1 Jul. 27, 2023

(30) Foreign Application Priority Data

Jan. 26, 2022 (KR) ........................ 10-2022-0011527

(51) Int. Cl.
*H10H 20/857* (2025.01)
*G09F 9/302* (2006.01)
(Continued)

(52) U.S. Cl.
CPC ......... *H10H 20/857* (2025.01); *G09F 9/3026* (2013.01); *G09F 9/33* (2013.01); *H10H 29/142* (2025.01)

(58) Field of Classification Search
CPC .......... G09F 9/3026; G09F 9/33; G09F 9/302; H10H 29/142; H10H 20/857; H05K 1/118;
(Continued)

(56) References Cited

U.S. PATENT DOCUMENTS 11,127,667 B2 9/2021 Lee et al.
11,791,253 B2 10/2023 Lee et al.
(Continued)

FOREIGN PATENT DOCUMENTS

KR 10-2010-0075035 7/2010
KR 10-2013-0059131 6/2013
(Continued)

OTHER PUBLICATIONS

Extended European Search Report issued dated Oct. 20, 2025, issued in corresponding European Patent Application No. 23747246.9 (11 pages).

*Primary Examiner* — Victor A Mandala
(74) *Attorney, Agent, or Firm* — Womble Bond Dickinson (US) LLP

(57) ABSTRACT

A display device includes a substrate including a display area including pixels, a pad area comprising pads and located adjacent to the display area and a side wiring area located adjacent to the pad area; and a printed circuit film attached to the pad area located on a back surface of the first substrate. The plurality of pads include first pads that electrically connect the printed circuit film to the pixels and at least one second pad disposed between adjacent ones of the first pads. The display device further includes at least one connection portion that electrically connects a first pad of the first pads and the at least one second pad to each other. Each of the first pads includes a first-first pad located on a front surface of the first substrate and a first-second pad located on the back surface of the first substrate.

20 Claims, 15 Drawing Sheets

PA: PA1, PA2, PA3
PE2: PE2a, PE2b

(51) Int. Cl.
*G09F 9/33* (2006.01)
*H10H 29/14* (2025.01)

(58) Field of Classification Search
CPC ......... H05K 2201/10128; H05K 3/361; H05K 59/10; H01L 25/167; H01L 25/0753; H01L 59/18; H10D 86/441
See application file for complete search history.

(56) References Cited

U.S. PATENT DOCUMENTS

| | | |
|---|---|---|
| 2016/0114458 A1 | 4/2016 | Bajaj et al. |
| 2020/0411594 A1 | 12/2020 | Sekar et al. |
| 2021/0132766 A1* | 5/2021 | Lee ........................ H10K 59/18 |
| 2021/0296394 A1* | 9/2021 | Meng ..................... H10H 20/01 |
| 2021/0375740 A1 | 12/2021 | Lee et al. |
| 2022/0208909 A1* | 6/2022 | Jeon ....................... G09F 9/3026 |
| 2022/0208945 A1* | 6/2022 | Lee ..................... H10K 59/1315 |
| 2022/0208952 A1* | 6/2022 | Shin ..................... H10K 59/131 |
| 2022/0209186 A1* | 6/2022 | Shim .................... H10K 50/844 |
| 2022/0320056 A1* | 10/2022 | Liang ................... H01L 25/167 |
| 2023/0005962 A1* | 1/2023 | Lee ..................... H01L 25/0753 |
| 2024/0170497 A1* | 5/2024 | Gong ..................... H10H 29/10 |

FOREIGN PATENT DOCUMENTS

| | | |
|---|---|---|
| KR | 10-2018-0029169 | 3/2018 |
| KR | 10-2018-0077835 | 7/2018 |
| KR | 1020190066242 A | 6/2019 |
| KR | 10-2019-0082338 | 7/2019 |
| KR | 10-2020-0038368 A | 4/2020 |
| KR | 10-2020-0076581 | 6/2020 |

\* cited by examiner

PA: PA1, PA2, PA3
PE2: PE2a, PE2b

PA_1: PA1, PA2, PA3, PA4, PA5

PA_1: PA1, PA3
PE2: PE2a, PE2b

DISPLAY DEVICE AND TILED DISPLAY DEVICE INCLUDING THE SAME

CROSS-REFERENCE TO RELATED APPLICATION

This application claims priority to and benefits of Korean Patent Application No. 10-2022-0011527 under 35 U.S.C. § 119, filed in the Korean Intellectual Property Office on Jan. 26, 2022, the entire contents of which are incorporated herein by reference.

BACKGROUND

1. Technical Field

The disclosure relates to a display device capable of preventing delamination of a driving pad caused by a test pad and a tiled display device including the same, which is capable of preventing delamination of a driving pad caused by a test pad.

2. Description of the Related Art

A display device is a device for displaying a moving image or a still image. The display device may be used as a display screen of various electronic devices such as televisions, laptop computers, monitors, billboards and the Internet of Things (IoT) and various portable electronic devices such as mobile phones, smart phones, tablet personal computers (tablet PCs), smart watches, watch phones, mobile communication terminals, electronic notebooks, electronic books, portable multimedia players (PMPs), navigation systems, and ultra mobile personal computers (UMPCs).

The display device includes a printed circuit board including a driver circuit, a plurality of signal wires electrically connecting light emitting elements, and a plurality of lead wires electrically connected to the signal wires to drive the light emitting elements. The display device includes a display area where an image is displayed and a portion (e.g., bezel) surrounding the display area, where an image is not displayed. The signal and lead wires may be bonded to the side surface of the display device by a bonding method (e.g., by a side-bonding method) to implement a bezel-less design.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of preventing delamination of a driving pad caused by a test pad.

Embodiments also provide a tiled display device capable of preventing delamination of a driving pad caused by a test pad.

However, embodiments of the disclosure are not limited to those set forth herein. The above and other embodiments will become more apparent to one of ordinary skill in the art to which the disclosure pertains by referencing the detailed description of the disclosure given below.

An embodiment of a display device comprises a first substrate comprising a display area comprising pixels, a pad area comprising a plurality of pads and located adjacent to the display area and a side wiring area located adjacent to the pad area; and a printed circuit film attached to the pad area located on a back surface of the first substrate. The plurality of pads comprise a plurality of first pads that electrically connect the printed circuit film to the pixels and at least one second pad disposed between adjacent ones of the plurality of first pads. The display device further comprises at least one connection portion that electrically connects a first pad of the plurality of first pads and the at least one second pad to each other. Each of the plurality of first pads comprises a first-first pad located on a front surface of the first substrate and a first-second pad located on the back surface of the first substrate. The display device further comprises side wirings that are disposed in the side wiring area and electrically connect the first-first pad and the first-second pad to each other.

The pad area may comprise a first pad area located on the front surface of the substrate; and a second pad area located on the back surface of the substrate, and the side wiring area may be disposed on a side surface between the front surface of the substrate and the back surface of the substrate.

The first-first pad may be disposed in the first pad area, and the first-second pad may be disposed in the second pad area.

The printed circuit film may be attached onto the second pad area through an anisotropic conductive film.

The at least one second pad may be disposed in the first pad area and the second pad area, and the at least one second pad may not be disposed in the side wiring area.

The at least one connection portion may be disposed in the first pad area and the second pad area, and the at least one connection portion may be not disposed in the side wiring area.

The at least one second pad may include a plurality of second pads, and the at least one connection portion may include a plurality of connection portions.

The at least one second pad and the at least one connection portion may be electrically connected to an adjacent first pad of the plurality of first pads in a plan view.

The at least one second pad may comprise a plurality of patterns separated from each other.

The plurality of patterns of the at least one second pad may be electrically connected to the first pad of the plurality of first pads via the at least one connection portion.

Each of the plurality of first pads may comprise a first lower pad portion; and a first upper pad portion on the first lower pad portion, and the first lower pad portion may be directly connected to the at least one connection portion.

The plurality of patterns of the at least one second pad may comprise a second lower pad portion; and a second upper pad portion on the second lower pad portion, and the second lower pad portion may be directly connected to the at least one connection portion.

The first lower pad portion and the second lower pad portion may be disposed on a same layer.

The first upper pad portion and the second upper pad portion may be disposed on a same layer.

An embodiment of a display device comprises a first substrate comprising a display area comprising pixels, a pad area comprising a plurality of pads and located adjacent to the display area and a side wiring area located adjacent to the pad area; a second substrate opposite to the first substrate; and a printed circuit film attached to the pad area located on a back surface of the first substrate. The plurality of pads comprise a plurality of first pads that electrically connect the printed circuit film to the pixels, and at least one second pad disposed between adjacent ones of the plurality of first pads and comprising a plurality of patterns, the display device further comprises at least one connection portion that electrically connects one first pad of the plurality of first pads and the plurality of patterns of the at least one second pad to each other. Each of the plurality of first pads comprises a first-first pad located on a front surface of the first substrate and a first-second pad located on the back surface of the first substrate. The display device further comprises side wirings that are disposed in the side wiring area and electrically connect the first-first pad and the first-second pad to each other.

The pad area may comprise a first pad area located on the front surface of the first substrate; and a second pad area located on the back surface of the first substrate, and the first pads may be disposed in the first pad area and the second pad area.

The at least one second pad may be disposed in the first pad area and the second pad area, and the at least one connection portion may be disposed in the first pad area and the second pad area.

The at least one second pad may include a plurality of second pads, the at least one connection portion may include a plurality of connection portions, and the plurality of second pads and the plurality of connection portions may be respectively and electrically connected to an adjacent first pad of the plurality first pads.

An embodiment of a tiled display device comprises a plurality of first substrates each comprising a display area comprising pixels, a pad area comprising a plurality of pads and located adjacent to the display area, and a side wiring area comprising side wirings and located adjacent to the pad area; and a printed circuit film attached to the pad area located on a back surface of each of the plurality of first substrates. Each of the plurality of first substrates comprises: a base substrate, a first conductive layer comprising a connection portion on the base substrate, an insulating layer on the first conductive layer, a second conductive layer comprising a first lower pad portion on the insulating layer and a second lower pad portion, and a third conductive layer comprising a first upper pad portion overlapping the first lower pad portion on the second conductive layer in a plan view and a second upper pad portion overlapping the second lower pad portion in a plan view. The plurality of pads comprise a plurality of first pads that electrically connect the printed circuit film to the pixels, and a second pad disposed between adjacent ones of the plurality of first pads. Each of the first pads comprises a first-first pad located on a front surface of each of the plurality of first substrates and a first-second pad located on the back surface of each of the plurality of first substrates. The side wirings electrically connect the first-first pad and the first-second pad to each other. The first lower pad portion and the first upper pad portion form the first-first pad. The second lower pad portion and the second upper pad portion form the second pad.

The pad area may comprise a first pad area located on the front surface of the plurality of first substrates; and a second pad area located on the back surface of the plurality of first substrates, and the side wiring area may connect the first pad area and the second pad area to each other.

It should be noted that the effects of the disclosure are not limited to those described above, and other effects of the disclosure will be apparent from the following description.

BRIEF DESCRIPTION OF THE DRAWINGS

An additional appreciation according to the embodiments of the disclosure will become more apparent by describing in detail the embodiments thereof with reference to the attached drawings, wherein.

DETAILED DESCRIPTION OF THE EMBODIMENTS

Figure 1:
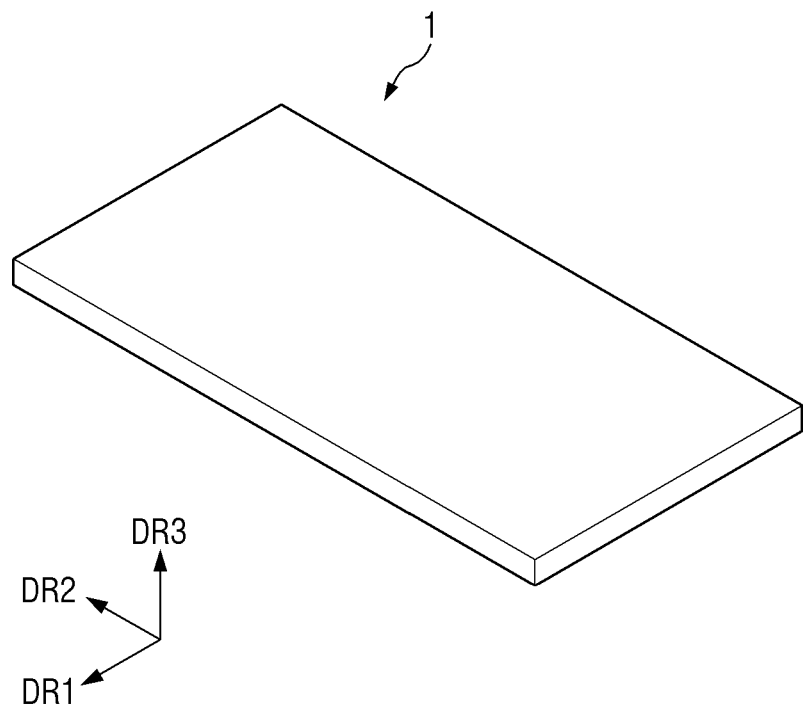
FIG. 1 is a schematic perspective view of a display device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated "embodiments" are to be understood as providing exemplary features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

In concluding the detailed description, those skilled in the art will appreciate that many variations and modifications can be made to the preferred embodiments without substantially departing from the principles of the disclosure. Therefore, the disclosed embodiments of the disclosure are used in a generic and descriptive sense only and not for purposes of limitation.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the present disclosure will be described with reference to the attached drawings.

Figure 2:
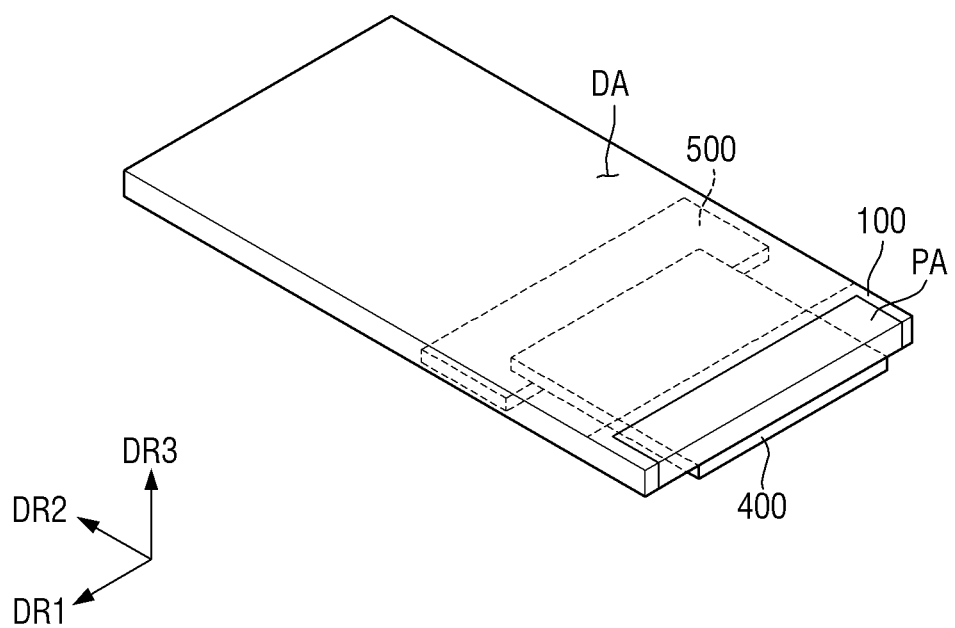
FIG. 2 is a detailed perspective view of the display device shown in FIG. 1.

FIG. 1 is a schematic perspective view of a display device according to an embodiment of the disclosure. FIG. 2 is a detailed perspective view of the display device shown in FIG. 1.

In FIGS. 1 and 2, a display device 1 according to the embodiment of the disclosure may be a subminiature light emitting diode display device (e.g., micro or nano light emitting diode display device) including a subminiature light emitting diode (e.g., micro or nano light emitting diode) as a light emitting element LE, but embodiments of the disclosure are not limited thereto.

Figure 3:
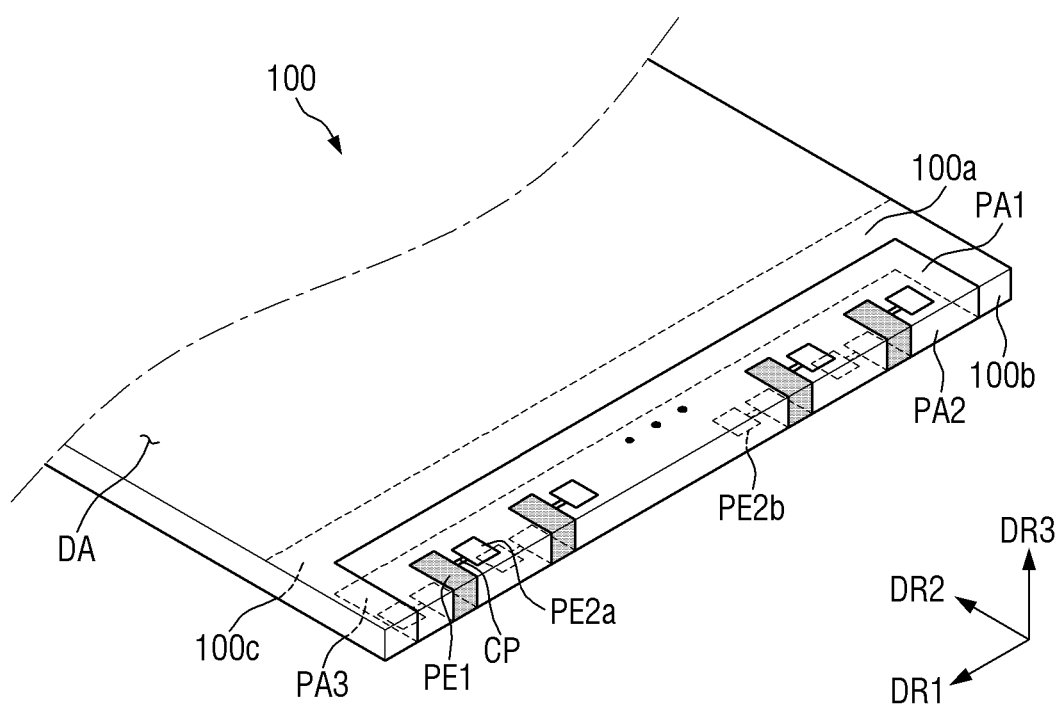
FIG. 3 is a schematic perspective view illustrating a first pad area, a second pad area, and a third pad area of a first substrate of the display device shown in FIG. 2.

In FIGS. 1 to 3, a first direction DR1 refers to a horizontal direction of the display device 1, a second direction DR2 refers to a vertical direction of the display device 1, and a third direction DR3 refers to a thickness direction of the display device 1. Also, the terms "left", "right", "upper", and "lower", as used herein, denote corresponding directions as viewed from above the display device 1. For example, the term "right side" denotes a side in the first direction DR1, the term "left side" denotes another side in the first direction DR1, the term "upper side" denotes a side in the second direction DR2, and the term "lower side" denotes another side in the second direction DR2. Also, the term "upper portion" denotes a side in the third direction DR3, and the term "lower portion" denotes another side in the third direction DR3.

Referring to FIGS. 1 and 2, the display device 1 may include a first substrate 100, a printed circuit film 400, and a main circuit board 500.

Although not illustrated in FIGS. 1 and 2, the display device 1 may further include various elements disposed on the first substrate 100.

For example, a micro light emitting diode (LED) may be used as the display device 1. In the following embodiments, a micro LED may be used as the display device 1. However, the disclosure is not limited thereto, and various types of display devices, such as an organic light emitting display (OLED), a liquid crystal display (LCD), a quantum dot organic light emitting display, a quantum dot liquid crystal display, a quantum nano light emitting display, and the like, may be used as the display device 1.

The first substrate 100 may include insulating layers, conductive layers, at least one thin film transistor, and a light emitting element electrically connected to the at least one thin film transistor.

For example, the first substrate 100 may include a base substrate, a thin film transistor layer including the at least one thin film transistor, a wavelength conversion layer including at least one wavelength conversion pattern, and a color filter layer including at least one color filter.

The first substrate 100 may include a base substrate. The base substrate of the first substrate 100 may include a rigid material, such as glass or quartz.

The display device 1 may have a rectangular shape with right-angled corners in a plan view. The display device 1 may have long sides and short sides in a plan view. The short side of the display device 1 may be a side extending in the first direction DR1. The long side of the display device 1 may be a side extending in the second direction DR2.

The first substrate 100 may include a display area DA. The display area DA of the first substrate 100 may include pixels arranged thereon. Each of the pixels may include at least one thin film transistor and a light emitting element.

The display area DA may have a rectangular shape with right-angled or rounded corners in a plan view. The display area DA may be substantially identical in shape with the display device 1 in a plan view. For example, the display area DA may have short sides and long sides. The long side of the display area DA may be a side extending in the second direction DR2. The short side of the display area DA may be a side extending in the first direction DR1. However, the planar shape of the display area DA is not limited to the rectangular shape, but may have a circular shape, an elliptical shape, or various other shapes.

The display device 1 may further include a pad area PA. The first substrate 100 of the display device 1 may include the pad area PA. As shown in FIG. 2, the pad area PA may be located on another side of the display area DA in the second direction DR2. The pad area PA may be defined over a surface (or a front surface) of the first substrate 100, a back surface (or another surface) of the first substrate 100 opposite to the front surface, and a side surface of the first substrate 100 between the front surface and the back surface. For example, the pad area PA may be defined on outer surfaces (e.g., the front surface, the back surface, and the side surface) of the first substrate 100.

The printed circuit film 400 may be attached to the pad area PA. For example, an end of the printed circuit film 400 may be attached to the pad area PA and another end of the printed circuit film 400 may be attached to the main circuit board 500.

As shown in FIG. 2, the printed circuit film 400 may be attached to the back surface of the first substrate 100.

Figure 4:
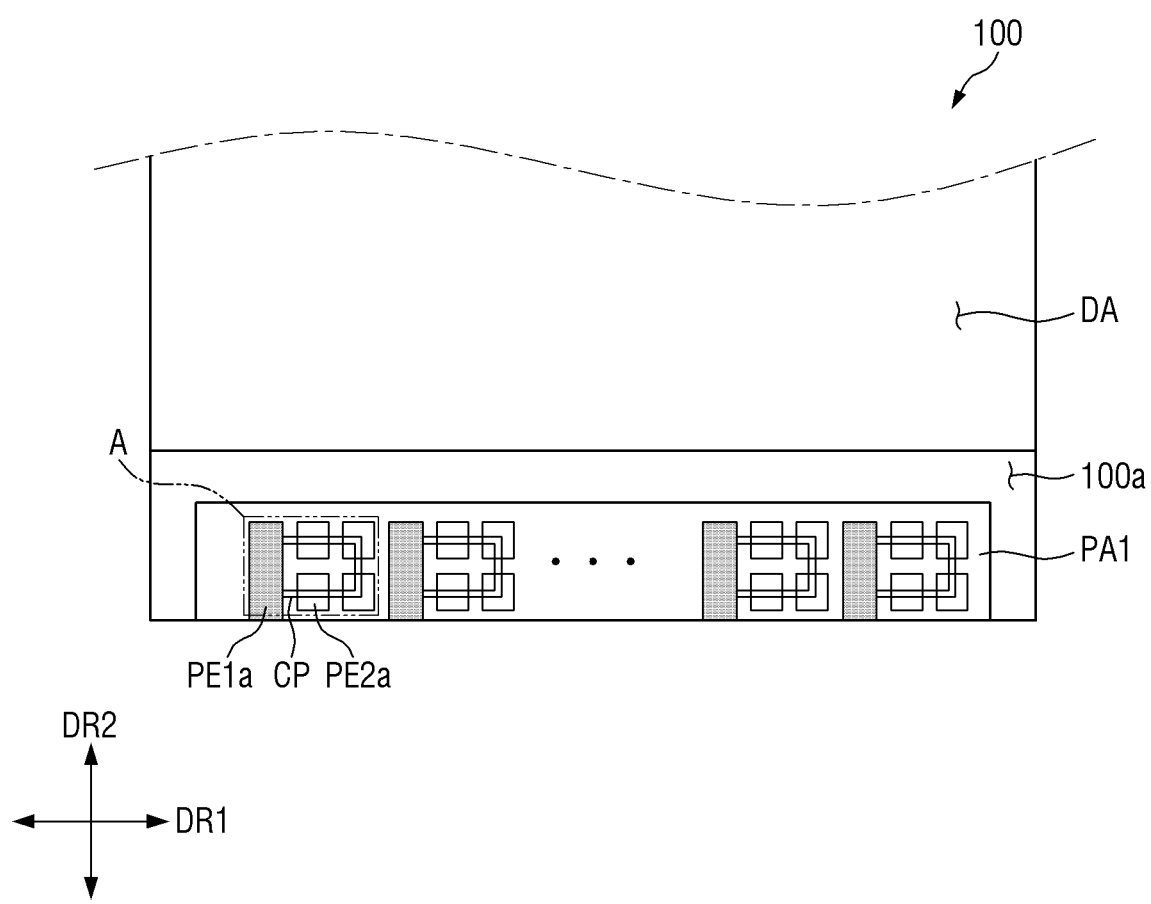
FIG. 4 is a schematic plan view of the first substrate shown in FIG. 3.
Figure 5:
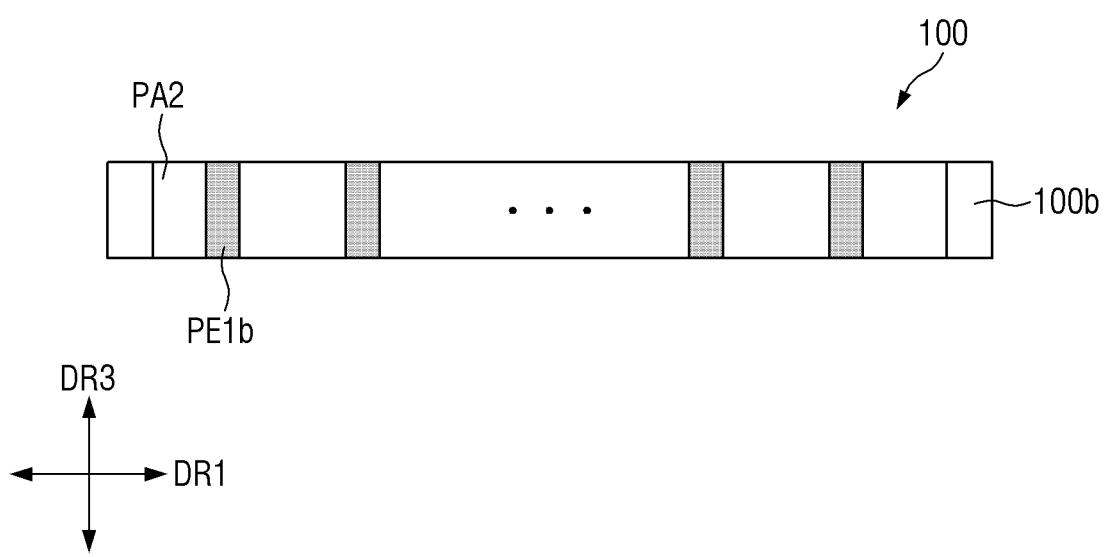
FIG. 5 is a schematic side view of the first substrate shown in FIG. 3.
Figure 6:
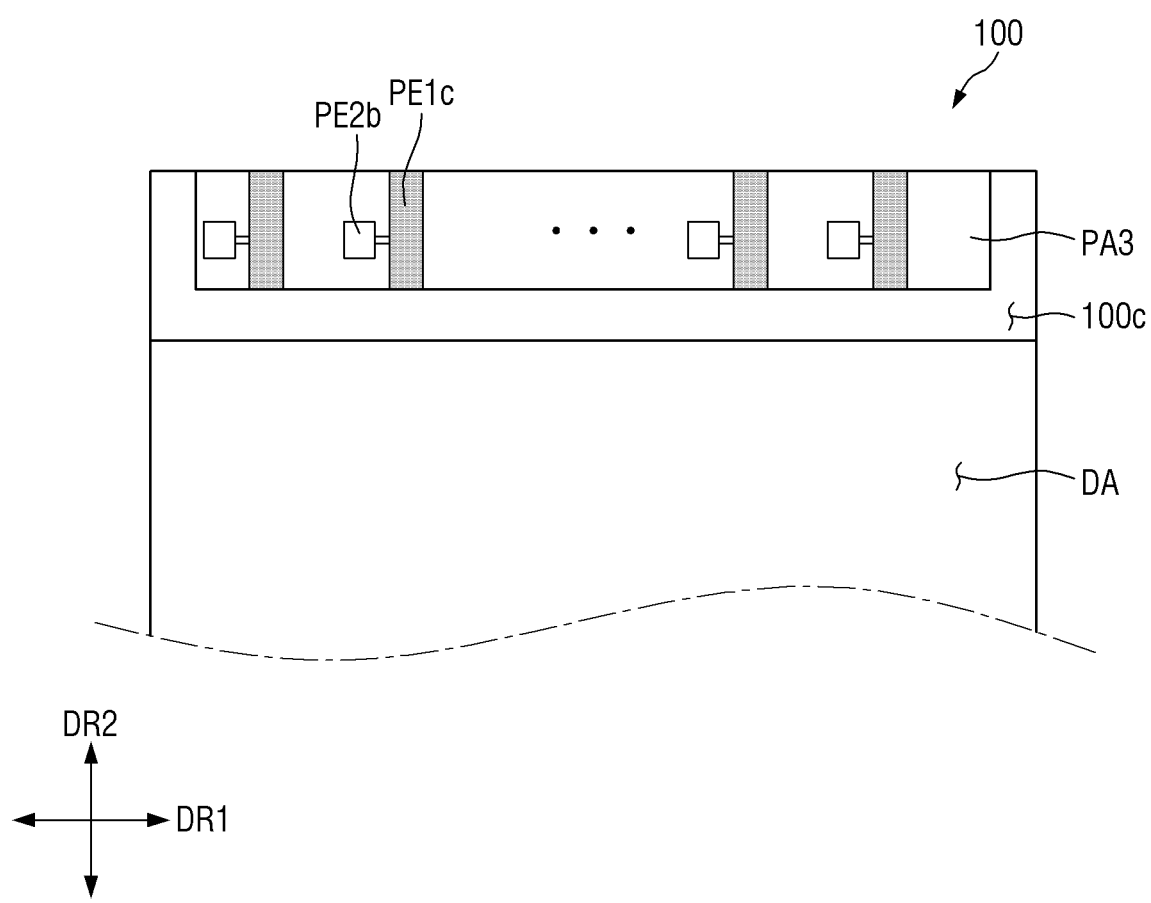
FIG. 6 is a schematic rear view of the first substrate shown in FIG. 5.

FIG. 3 is a schematic perspective view illustrating a first pad area, a second pad area, and a third pad area of the first substrate of the display device shown in FIG. 2. FIG. 4 is a schematic plan view of the first substrate shown in FIG. 3. FIG. 5 is a schematic side view of the first substrate shown in FIG. 3. FIG. 6 is a schematic rear view of the first substrate shown in FIG. 5.

In FIG. 3, a front surface 100a, a side surface 100b, and a back surface 100c of the first substrate 100 are illustrated. Another side portion (e.g., another side portion of the first substrate 100) in the second direction DR2 is enlarged to show the pad area PA of the first substrate 100 in more detail.

Referring to FIGS. 3 to 6, the pad area PA may include a first pad area PA1 located on the front surface 100a of the first substrate 100, a second pad area PA2 located on the side surface 100b, and a third pad area PA3 located on the back surface 100c.

The first substrate 100 may further include a first pad PE1, a second pad PE2, and a connection portion CP. The first pad PE1 may be a driving pad that electrically connects the printed circuit film 400 (see FIG. 2) to the pixels of the display area DA, and the second pad PE2 may be a test pad for determining the disconnection of the first pad PE1. The connection portion CP may electrically connect the first pad PE1 to the second pad PE2.

As shown in FIGS. 3 to 6, the first pad PE1 may be disposed over the first to third pad areas PA1 to PA3. The second pad PE2 may be disposed in the first pad area PA1 and the third pad area PA3, but may not be disposed in the second pad area PA2. The connection portion CP may be disposed in the first pad area PA1 and the third pad area PA3, but may not be disposed in the second pad area PA2.

The first pad PE1, the second pad PE2, and the connection portion CP may each be provided in plural form. For example, the second pad PE2 and the connection portion CP may each be disposed between adjacent ones of the first pads PE1, and a first pad PE1, a second pad PE2, and a connection portion CP may be grouped into a set.

As shown in FIGS. 3 and 4, the second pad PE2 may include separate patterns. For example, the second pad PE2 may include four separate patterns. The separate patterns of the second pad PE2 may be arranged in two columns in the first direction DR1 and two rows in the second direction DR2. For example, the separate patterns may be arranged in the form of a matrix arrangement. However, the disclosure is not limited thereto, and the separate patterns of the second pad PE2 may be five or more, or two to three, and may be randomly arranged, not in the form of a matrix arrangement. However, each of the separate patterns may be electrically connected (e.g., directly connected) to the connection portion CP and may be electrically connected to the first pad PE1 via the connection portion CP. For convenience of description, the following description will focus on the second pad PE2 including four separate patterns.

The first pad PE1 may include a first-first pad PE1a located in the first pad area PA1, a first-second pad PE1b located in the second pad area PA2, and a first-third pad PE1c located in the third pad area PA3. The first-first pad PE1a, the first-second pad PE1b, and the first-third pad PE1c may be electrically connected to one another. For example, the first-first pad PE1a and the first-second pad PE1b may be electrically connected (e.g., directly connected) to each other, and the first-second pad PE1*b* and the first-third pad PE1*c* may be electrically connected (e.g., directly connected) to each other. Further, the second pad PE2 may include a second-first pad PE2*a* located in the first pad area PA1 and a second-second pad PE2*b* located in the third pad area PA3.

Description of the first pad PE1, the second pad PE2, and the connection portion CP is provided below with reference to FIGS. 7 to 9.

Figure 7:
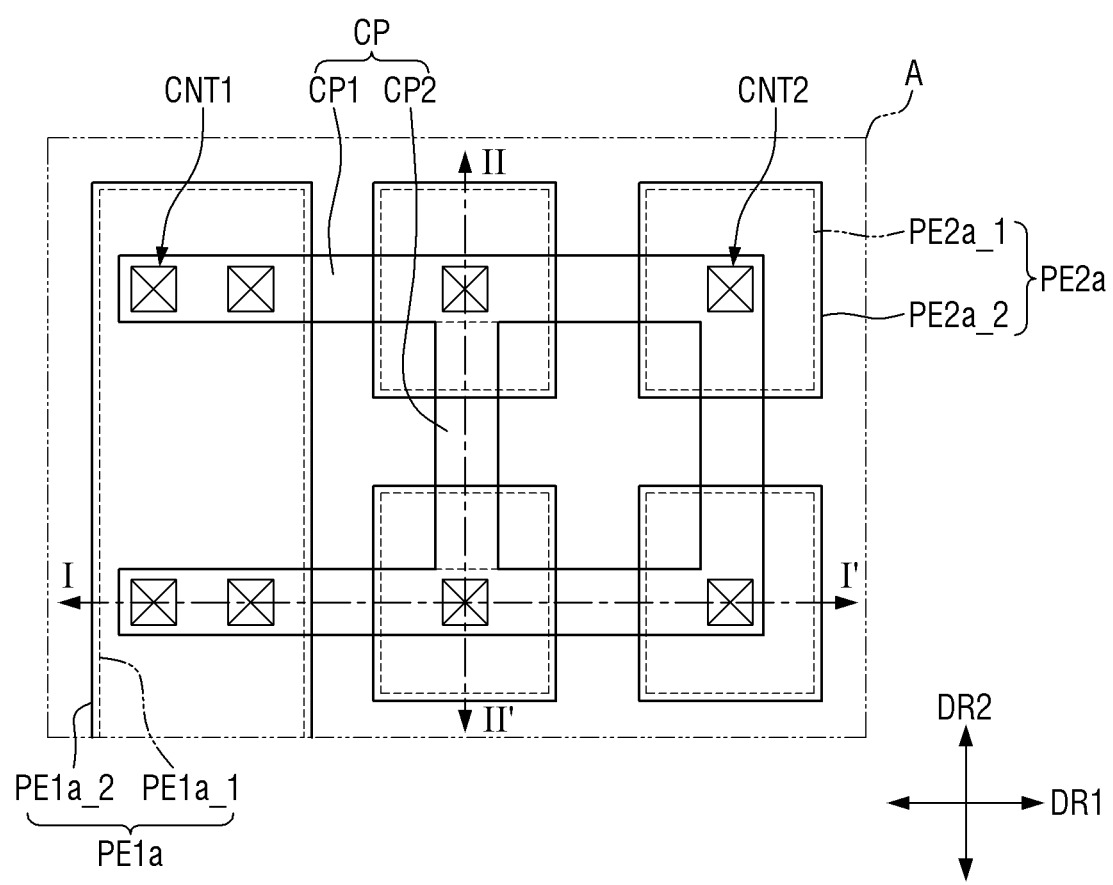
FIG. 7 is a schematic enlarged plan view of area A of FIG. 6.

FIG. 7 is a schematic enlarged plan view of area A of FIG. 6. FIG. 8 is a schematic cross-sectional view taken along line I-I' of FIG. 7. FIG. 9 is a schematic cross-sectional view taken along line II-II' of FIG. 7.

In FIG. 7, the first-first pad PE1a of the first pad PE1, the connection portion CP, and the second-first pad PE2*a* are illustrated. The stacked structure, the planar shape, or the like of the first-third pad PE1*c*, the connection portion CP, and the second-second pad PE2*b* that are located in the third pad area PA3 are substantially the same as those of the first-first pad PE1a, the connection portion CP, and the second-first pad PE2*a*, except the location of the area thereof (e.g., except the location of the third pad area PA3 of the first-third pad PE1*c*, the connection portion CP, and the second-second pad PE2*b*). Therefore, detailed descriptions of the first-third pad PE1*c*, the connection portion CP, and the second-second pad PE2*b* is omitted.

Figure 8:
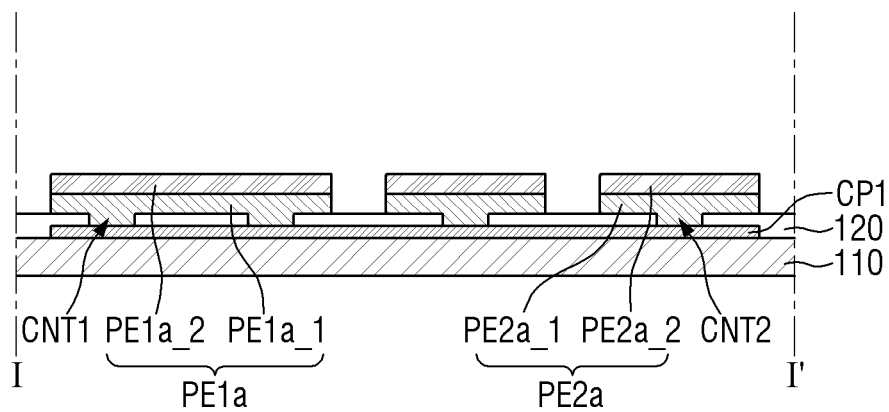
FIG. 8 is a schematic cross-sectional view taken along line I-I' of FIG. 7.
Figure 9:
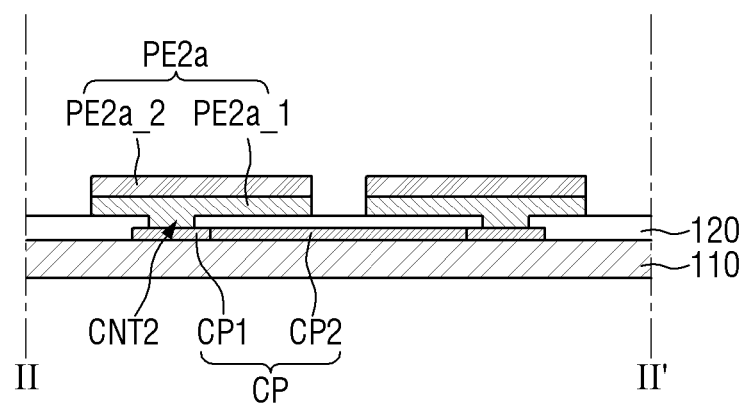
FIG. 9 is a schematic cross-sectional view taken along line II-II' of FIG. 7.

Referring to FIGS. 7 to 9, the first-first pad PE1a may include a first lower pad portion PE1*a*_1 and a first upper pad portion PE1*a*_2 on the first lower pad portion PE1*a*_1. The second-first pad PE2*a* may include a second lower pad portion PE2*a*_1 and a second upper pad portion PE2*a*_2 on the second lower pad portion PE2*a*_1. The connection portion CP may include a first connection portion CP1 extending in the first direction DR1 and a second connection portion CP2 extending in the second direction DR2.

The first lower pad portion PE1*a*_1 and the first upper pad portion PE1*a*_2 on the first lower pad portion PE1*a*_1 may overlap each other in a plan view. The second lower pad portion PE2*a*_1 and the second upper lower pad portion PE2*a*_2 on the second lower pad portion PE2*a*_1 may overlap each other in a plan view. The first lower pad portion PE1*a*_1 may have a rectangular shape in a plan view. However, the planar shape of the first lower pad portion PE1*a*_1 is not limited to the rectangular shape, but may have a circular shape, an elliptical shape, or other polygonal shapes. The first upper pad portion PE1*a*_2 and the first lower pad portion PE1*a*_1 may have a same planar shape, but is not limited thereto. The second lower pad portion PE2*a*_1 may have a rectangular shape in a plan view. However, the planar shape of the second lower pad portion PE2*a*_1 is not limited to the rectangular shape, but may have a circular shape, an elliptical shape, or other polygonal shapes. The second upper pad portion PE2*a*_2 and the second lower pad portion PE2*a*_1 may have a same planar shape, but is not limited thereto.

As shown in FIG. 7, the area of the first-first pad PE1*a* may be greater than the area of the second-first pad PE2*a* in a plan view.

The first connection portion CP1 may extend in the first direction DR1 as shown in FIG. 7, and may be provided in plural form. The first connection portion CP1 located on a side in the second direction DR2 in a plan view and another first connection portion CP1 located on another side in the second direction DR2 in a plan view may be arranged in parallel to each other. For example, adjacent ones of the first connection portions CP1 may be arranged in parallel to each other in the second direction DR2. Hereinafter, the first connection portion CP1 located on a side in the second direction DR2 is referred to as an upper first connection portion CP1, and another first connection portion CP1 located on another side in the second direction DR2 is referred to as a lower first connection portion CP1.

The upper first connection portion CP1 may overlap a side portion of the first-first pad PE1a in the second direction DR2 and a row of the second-first pad PE2*a* on a side in the second direction DR2 in a plan view. The lower first connection portion CP1 may overlap another side portion of the first-first pad PE1*a* in the second direction DR2 and a row of the second-first pad PE2*a* on another side in the second direction DR2 in a plan view.

The second connection portion CP2 may extend in the first direction DR1 as shown in FIG. 7, and may be provided in plural form. The second connection portion CP2 located on a side in the first direction DR1 in a plan view and another second connection portion CP2 located on another side in the first direction DR1 in a plan view may be arranged in parallel to each other. For example, adjacent ones of the second connection portions CP2 may be arranged in parallel to each other in the first direction DR1. Hereinafter, the second connection portion CP2 located on a side in the first direction DR1 is referred to as a right second connection portion CP2, and another second connection portion CP2 located on another side in the first direction DR1 is referred to as a left second connection portion CP2.

The right second connection portion CP2 may overlap a row of the second-first pad PE2*a* on a side in the first direction DR1 in a plan view. The left second connection portion CP2 may overlap a row of another second-first pad PE2*a* on another side in the first direction DR1 in a plan view.

The upper first connection portion CP1 may be electrically connected (e.g., directly connected) to an end of the left second connection portion CP2 in the second direction DR2 and an end of the right second connection portion CP2 in the second direction DR2. The lower first connection portion CP1 may be electrically connected (e.g., directly connected) to another end of the left second connection portion CP2 in the second direction DR2 and another end of the right second connection portion CP2 in the second direction DR2.

Referring to FIGS. 7 to 9, the first substrate 100 may include a first base member 110, a first conductive layer on the first base member 110, a first insulating layer 120 on the first conductive layer, a second conductive layer on the first insulating layer 120, and a third conductive layer on the second conductive layer.

The first base member 110 may be made of a material having transparency. In some embodiments, the first base member 110 may be a glass substrate or a plastic substrate. In case that the first base member 110 is a plastic substrate, the first base member 110 may have flexibility.

The first conductive layer may be disposed on the first base member 110. In an embodiment, the first conductive layer may include the connection portion CP. Although not illustrated, the first conductive layer may further include a gate electrode of a thin film transistor, a first electrode of a reserve capacitor, a scan signal line that transmits a scan signal to the gate electrode, or the like.

The first conductive layer may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). Although the first conductive layer is a single film in the drawing, the first conductive layer may be a multilayer film. The multilayer film of the first conductive layer may be a stacked film made of different materials selected from the metals listed above.

The first insulating layer 120 may be disposed on the first conductive layer. The first insulating layer 122 may include an inorganic insulating material including at least one of silicon oxide, silicon nitride, silicon oxynitride, hafnium oxide, aluminum oxide, titanium oxide, tantalum oxide, and zirconium oxide, or an organic insulating material including at least one of a polyacrylate-based resin, an epoxy resin, a phenolic resin, a polyamide-based resin, a polyimide-based resin, an unsaturated polyester-based resin, a polyphenylene-ether-based resin, a polyphenylene sulfide-based resin, and benzocyclobutene (BCB). However, the disclosure is not limited thereto. In the drawing, the first insulating layer 120 may be a single film, but is not limited thereto. The first insulating layer 120 may be a multilayer film consisting of a stacked film including different materials.

The second conductive layer may be disposed on the first insulating layer 120. In an embodiment, the second conductive layer may include the first lower pad portion PE1a_1 and the second lower pad portion PE2a_1. Although not illustrated, the second conductive layer may further include the source electrode, a drain electrode of the thin film transistor, and a supply voltage electrode of the thin film transistor.

The third conductive layer may be disposed on the second conductive layer. The third conductive layer may include the first upper pad portion PE1a_2 and the second upper pad portion PE2a_2. The third conductive layer may include a transparent conductive electrode. The transparent conductive electrode may include ITO or IZO. However, the third conductive layer may have the transparent conductive electrode or a metal layer containing at least one metal of Ag, Mg, Al, Pt, Pd, Au, Ni, Nd, Ir, and Cr. In an embodiment, the third conductive layer may have a multilayer structure, e.g., a double-layer structure of ITO/Ag, Ag/ITO, ITO/Mg and ITO/MgF, or a triple-layer structure of ITO/Ag/ITO, as well as the transparent conductive electrode.

As shown in FIGS. 8 and 9, the first lower pad portion PE1a_1 may be electrically connected to the first connection portion CP1 via a first contact hole CNT1. The second lower pad portion PE2a_1 may be electrically connected to the first connection portion CP1 via a second contact hole CNT2. In FIG. 9, the first substrate 100 may include two first contact holes CNT1, but the disclosure is not limited thereto. The first substrate 100 may include a first contact hole CNT1 or three or more first contact holes CNT1. Although in FIG. 9 the first substrate 100 may include the single second contact hole CNT2 connecting the first lower pad portion PE1a_1 to the first connection portion CP1, the disclosure is not limited thereto. The first substrate 100 may include two or more second contact holes CNT2 that connect the first lower pad portion PE1a_1 to the first connection portion CP1.

The first upper pad portion PE1a_2 may be disposed on the first lower pad portion PE1a_1. The second upper pad portion PE2a_2 may be disposed on the second lower pad portion PE2a_1. The first upper pad portion PE1a_2 may be disposed (e.g., disposed directly) on the first lower pad portion PE1a_1. The second upper pad portion PE2a_2 may be disposed (e.g., disposed directly) on the second lower pad portion PE2a_1.

The second-first pad PE2a according to an embodiment may include the separate patterns as described above. Further, the second-first pad PE2a may be a test pad for determining the disconnection of the first pad PE1. In case that the test for the disconnection of the first pad PE1 is conducted using the second-first pad PE2a including only a pattern without the separate patterns, which is a test pad, delamination of the second-first pad PE2a may occur, and the probability of delamination of the first pad PE1 may be increased. In more detail, in case that the test for determining the disconnection of the first pad PE1, which partially overlaps the second-first pad PE2a and the second-second pad PE2b in a plan view (e.g., in FIG. 7, the first-first pad PE1a overlaps the second-first pad PE2a and the first-third pad PE1c overlaps the second-second pad PE2b in the thickness direction), is performed by bringing a probe pin into contact with each of the second-first pad PE2a and the second-second pad PE2b, the contact with the probe pin may cause a physical impact to each of the second-first pad PE2a and the second-second pad PE2b, which may lead to the delamination of each of the second-first pad PE2a and the second-second pad PE2b. As a result, the first pad PE1 overlapping the second-first pad PE2a and the second-second pad PE2b in a plan view may be delaminated.

The first pad PE1 may be formed not to overlap each of the second-first pad PE2a and the second-second pad PE2b in a plan view. However, in case that the probe pin is brought into contact with each of the second-first pad PE2a and the second-second pad PE2b, which is located very close to the first pad PE1, the probe pin may be in direct contact with the first pad PE1, and the direct contact may cause delamination of the first pad PE1.

According to an embodiment, each of the second-first pad PE2a and the second-second pad PE2b may include separate patterns. Accordingly, even if the contact with the probe pin causes the physical impact to some separate patterns of the second-first pad PE2a and the second-second pad PE2b during the test for determining the disconnection of the first pad PE1 by bringing the probe pin into contact with each of the second-first pad PE2a and the second-second pad PE2b, the separate patterns of the second-first pad PE2a and the second-second pad PE2b may be less likely to be delaminated since the separate patterns are indirectly connected to other separate patterns of the second-first pad PE2a and the second-second pad PE2b via the connection portions CP.

Even if some separate patterns of the second-first pad PE2a and the second-second pad PE2b are delaminated due to a physical impact caused by the contact with the probe pin, other separate patterns of the second-first pad PE2a and the second-second pad PE2b may be physically spaced apart from the separate patterns and thus delamination of other separate patterns of the second-first pad PE2a and the second-second pad PE2b may be prevented. Thus, the probability of delamination of the first pad PE1 may be significantly reduced.

Hereinafter, other embodiments are described below.

Figure 10:
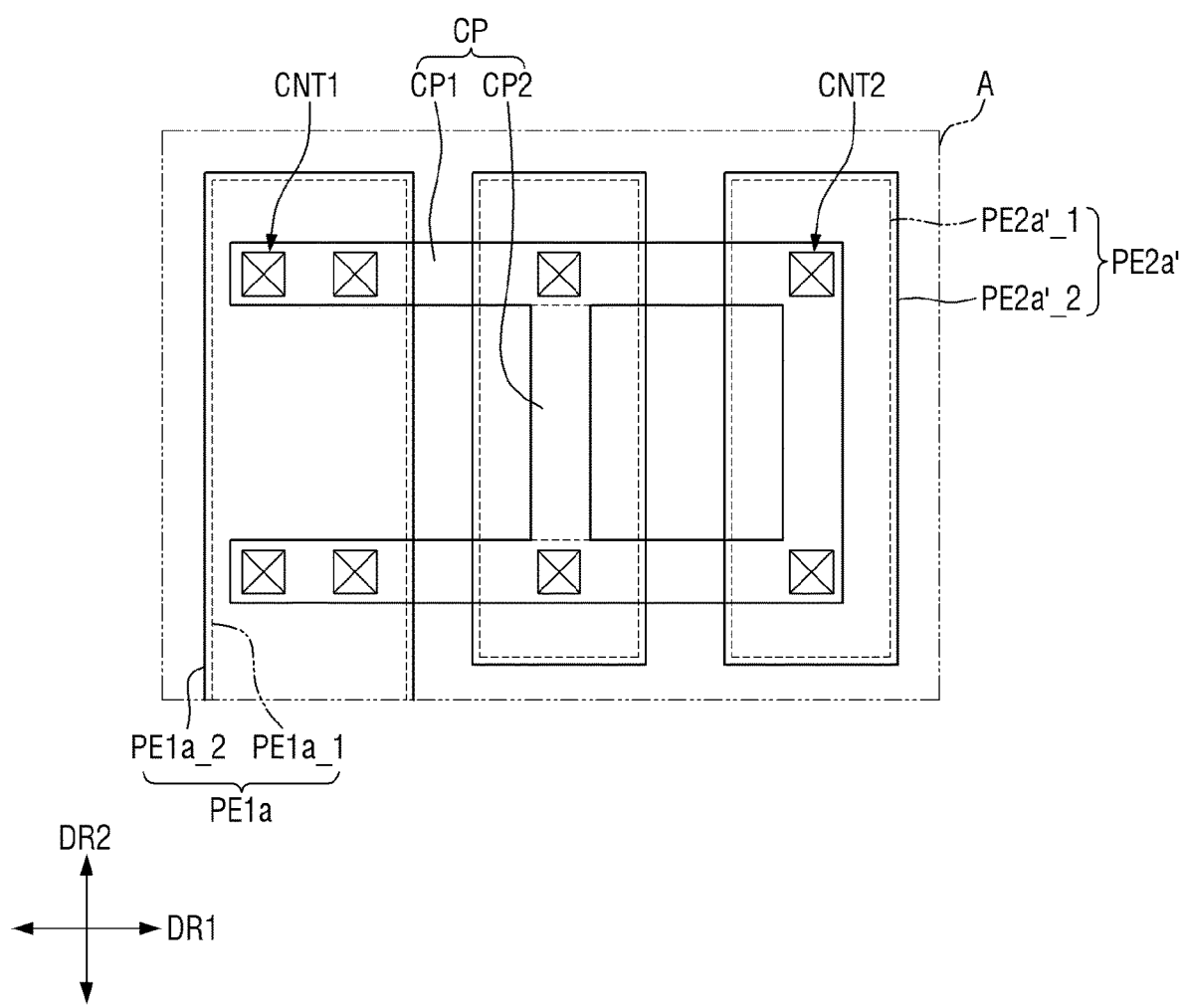
FIG. 10 is a schematic enlarged plan view of area A of FIG. 4 according to another embodiment of the disclosure.

FIG. 10 is a schematic enlarged plan view of area A of FIG. 4 according to another embodiment of the disclosure.

Referring to FIG. 10, the embodiment is different from the display device of FIG. 8 at least in that a second lower pad portion PE2a'_1 has a rectangular shape having long sides extending in the second direction DR2 and short sides extending in the first direction DR1 in a plan view and a second-first pad PE2a' includes two separate patterns.

However, the second lower pad portion PE2a_1 is not limited to the rectangular shape, but may have a circular shape, an elliptical shape, or other polygonal shapes. A second upper pad portion PE2a_2 and the second lower pad portion PE2a_1 may have a same planar shape, but is not limited thereto.

According to the embodiment, the second-first pad PE2a' may include separate patterns. Accordingly, in case that a probe pin is brought to contact the second-first pad PE2a' and the contact with the probe pin (e.g., the contact of the second-first pad PE2a' with the probe pin) causes a physical impact to some separate patterns of the second-first pad PE2a' during a test for determining the disconnection of a first pad PE1, the separate patterns of the second-first pad PE2a' may be less likely to be delaminated since the separate patterns are indirectly connected to other separate patterns of the second-first pad PE2a' via a connection portion CP.

Even if some separate patterns of the second-first pad PE2a' are delaminated due to the physical impact caused by the contact with the probe pin, other separate patterns of the second-first pad PE2a' may be physically spaced apart from the separate patterns. Thus, delamination of other separate patterns of the second-first pad PE2a' may be prevented. Therefore, the probability of delamination of the first pad PE1 may be significantly reduced.

Figure 11:
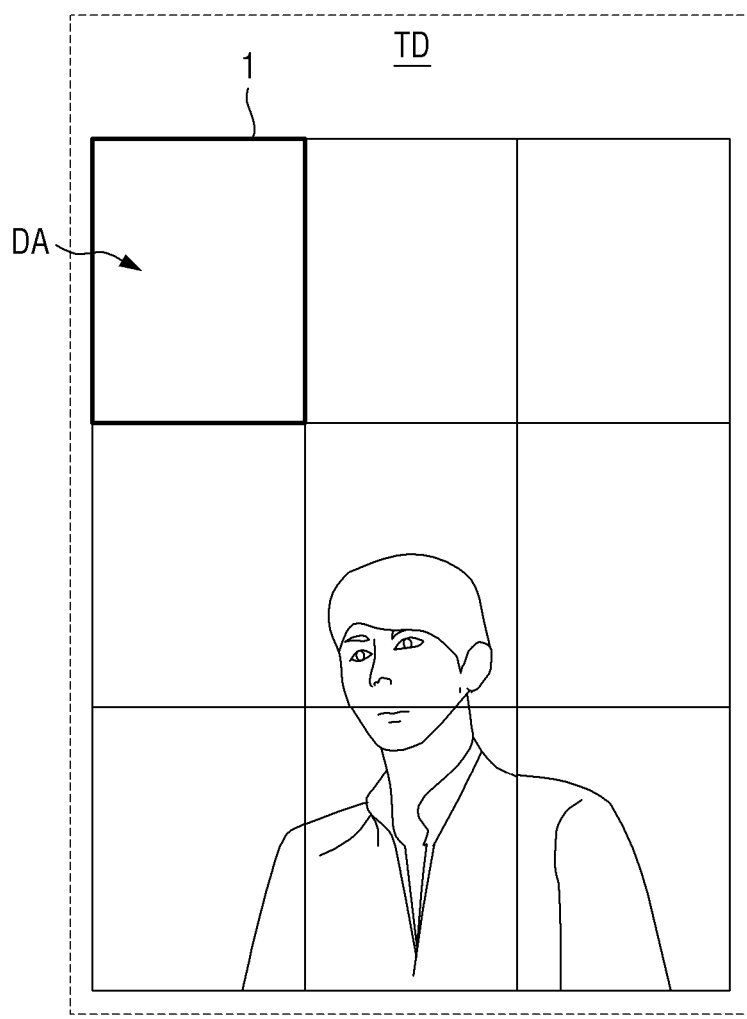
FIG. 11 is a schematic plan view of a tiled display device according to an embodiment of the disclosure.

FIG. 11 is a schematic plan view of a tiled display device according to an embodiment of the disclosure.

Referring to FIG. 11, a display device according to the embodiment differs from the display device 1 of FIG. 1 at least in that multiple display devices 1 are used as a tiled display device TD.

For example, in an embodiment, the display devices 1 may be arranged in a grid shape, but the disclosure is not limited thereto. For example, the display devices 1 may be arranged to be connected in a direction, connected in another direction that intersects the direction, and connected to have a shape. The display devices 1 may have a same size, but the disclosure is not limited thereto, and the display devices 1 may be of different sizes.

Each of the display devices 1 is described above with reference to FIGS. 1 to 3, and thus detailed descriptions of the same constituent elements is omitted.

The display devices 1 may be disposed such that the long sides or short sides are connected to each other. For example, the long side of a display device of the display devices 1 may be connected to another long side of another display device, and the short side of the display device of the display devices 1 may be connected to another short side of another display device of the display devices 1. Some of the display devices 1 may form a side of the tiled display device TD, and some of the display devices 1 may be located at a corner of the tiled display device TD to form two adjacent sides of the tiled display device TD. Some of the display devices 1 may be located inside the tiled display device TD and adjacent to (e.g., surrounded by) the display devices of the display devices 1, which form the two adjacent sides of the tiled display device TD. The display devices 1 may have different bezel shapes according to the positions of the display devices 1. In some embodiments, the display devices 1 may have a same bezel shape.

The display devices 1 of the tiled display device TD may be flat display devices, but the disclosure is not limited thereto. In some embodiments, the tiled display device TD may have a three-dimensional shape, and provide a three-dimensional effect. In case that the tiled display device TD has the three-dimensional shape, each of the display devices 1 included in the tiled display device TD may have a curved shape. For example, multiple flat display devices may be connected at an angle to each other to three-dimensionally form an entire shape (e.g., the curved shape) of the tiled display device TD. In some embodiments, multiple flat display devices may be connected to each other at an angle (e.g., a predetermined angle or selectable angle) to three-dimensionally form the entire shape of the tiled display device TD.

Figure 12:
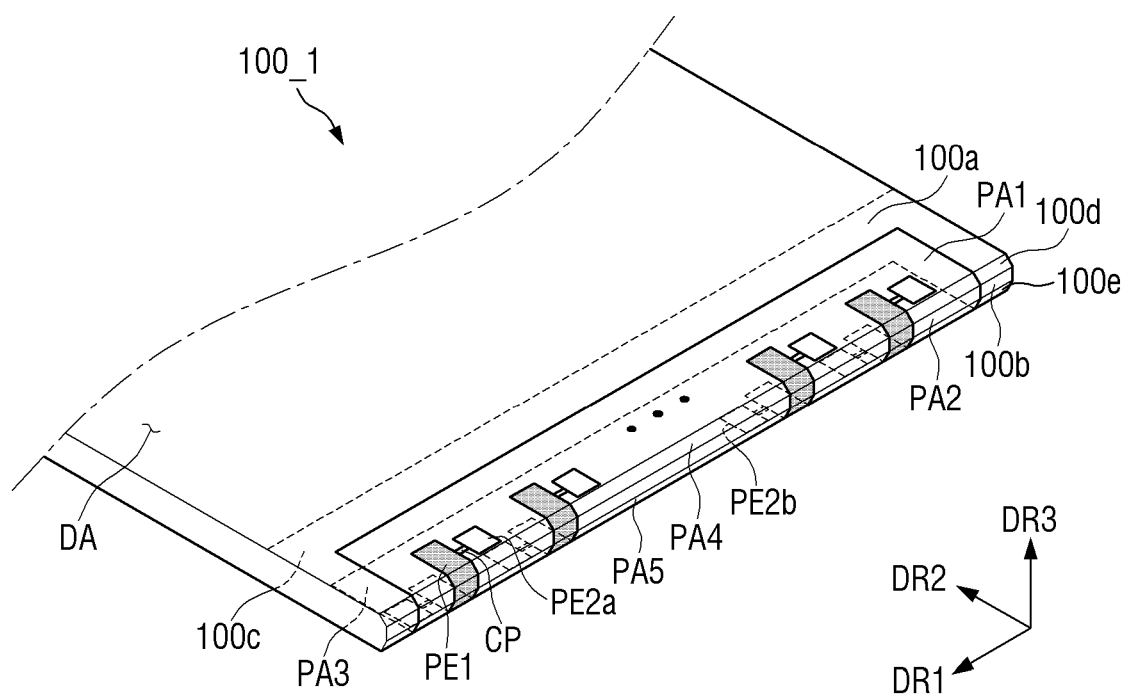
FIG. 12 is a schematic perspective view illustrating a first pad area, a second pad area, a third pad area, a fourth pad area, and a fifth pad area of a first substrate according to another embodiment of the disclosure.

FIG. 12 is a schematic perspective view illustrating a first pad area, a second pad area, a third pad area, a fourth pad area, and a fifth pad area of a first substrate according to another embodiment of the disclosure.

Referring to FIG. 12, a first substrate 100_1 according to the embodiment differs from the first substrate 100 of FIG. 3 at least in that the first substrate 100_1 further includes a first surface 100d between a front surface 100a and a side surface 100b and a second surface 100e between the side surface 100b and a back surface 100c, and a pad area PA_1 further includes a fourth pad area PA4 on the first surface 100d and a fifth pad area PA5 on the second surface 100e.

The first substrate 100_1 of the embodiment is different from the first substrate 100 of FIG. 3 at least in that a first pad PE1 is disposed over the first to fifth pad areas PA1 to PA5.

Detailed descriptions of the same constituent elements are omitted.

Figure 13:
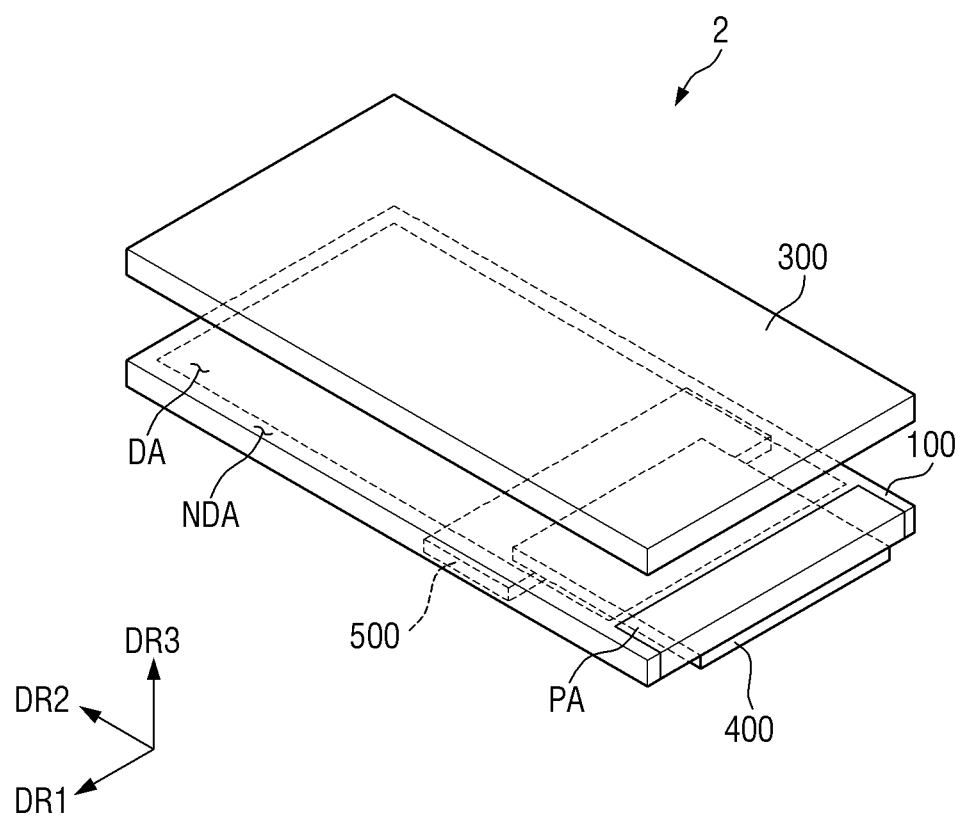
FIG. 13 is a detailed perspective view of a display device according to still another embodiment of the disclosure.

FIG. 13 is a detailed perspective view of a display device according to still another embodiment of the disclosure.

Referring to FIG. 13, a display device 2 according to the embodiment differs from the display device 1 of FIGS. 1 and 2 at least in that the display device 2 may further include a second substrate 300 opposite to the first substrate 100.

The first substrate 100 and the second substrate 300 may have substantially a same shape in a plan view. Side portions (e.g., lower short side portions in the second direction DR2) of the first substrate 100 and the second substrate 300 may be polished, and a side surface of the first substrate 100 and a side surface of the second substrate 300 may be aligned in a thickness direction (e.g., third direction DR3). In other side portions (e.g., upper short side portions in the second direction DR2, right long side portion in the first direction DR1, and left long side portions in the first direction DR1) of the first substrate 100 and the second substrate 300, the side surfaces of the first substrate 100 and the second substrate 300 may be aligned in the thickness direction, but the disclosure is not limited thereto.

Each of the first substrate 100 and the second substrate 300 may include a base substrate. The base substrates of the first substrate 100 and the second substrate 300 may each include a rigid material, such as glass or quartz.

In the embodiment, the first substrate 100 may be a thin film transistor substrate on which a thin film transistor layer including at least one thin film transistor is disposed. A wavelength conversion layer including at least one wavelength conversion pattern and a color filter layer including at least one color filter may be disposed on the second substrate 300.

A non-display area NDA of the first substrate 100 may be disposed adjacent to (e.g., around or surround) a display area DA. The non-display area NDA may be disposed adjacent to short sides (e.g., both short sides) and long sides (e.g., both long sides) of the display area DA. The non-display area NA may be adjacent to the sides (e.g., surround all sides) of the display area DA and form an edge of the display area DA. However, the disclosure is not limited thereto, and the non-display area NDA may be disposed adjacent to only both short sides or both long sides of the display area DA.

Although not illustrated, the non-display area NDA of the first substrate 100 according to the embodiment may further include a sealing area. The sealing area may be disposed in the non-display area NDA and may be sequentially disposed along the edges of the first and second substrates 100 and 300. The sealing member may include frit or the like and may be disposed in the sealing area. The sealing member may be disposed between the first and second substrates 100 and 300 and bond the first and second substrates 100 and 300 together.

The sealing area may have a shape of a rectangle frame arranged to be sequentially disposed along the edges of the first and second substrates 100 and 300.

Detailed descriptions of the same constituent elements is omitted.

Figure 14:
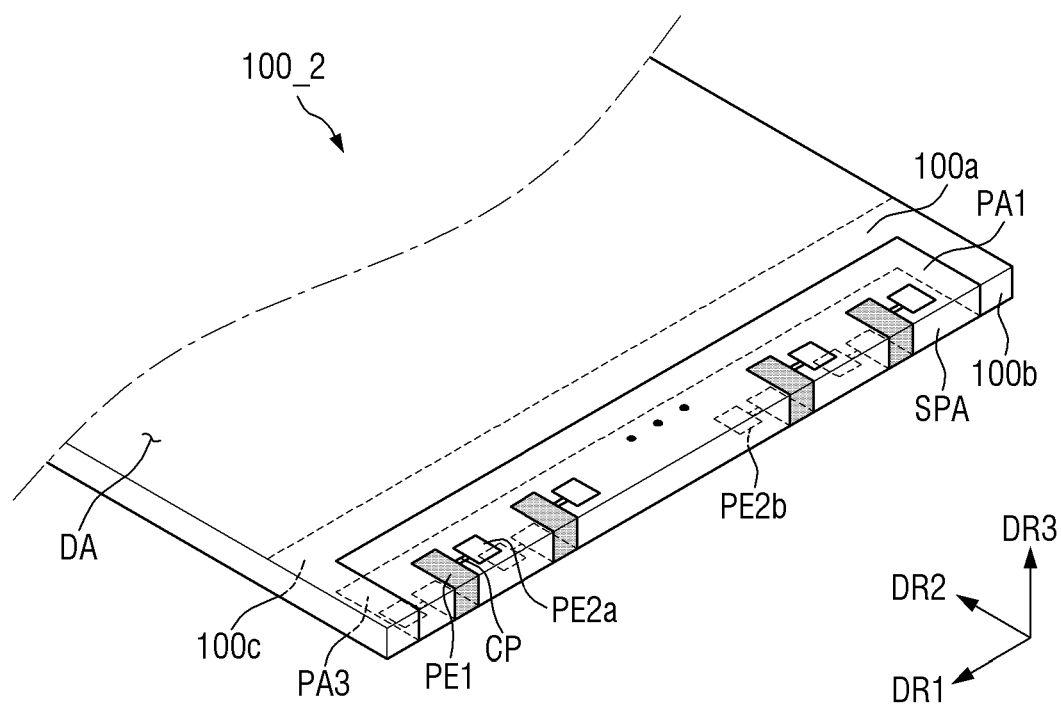
FIG. 14 is a schematic perspective view illustrating a pad area and a side wiring area of a first substrate of a display device according to still another embodiment of the disclosure.
Figure 15:
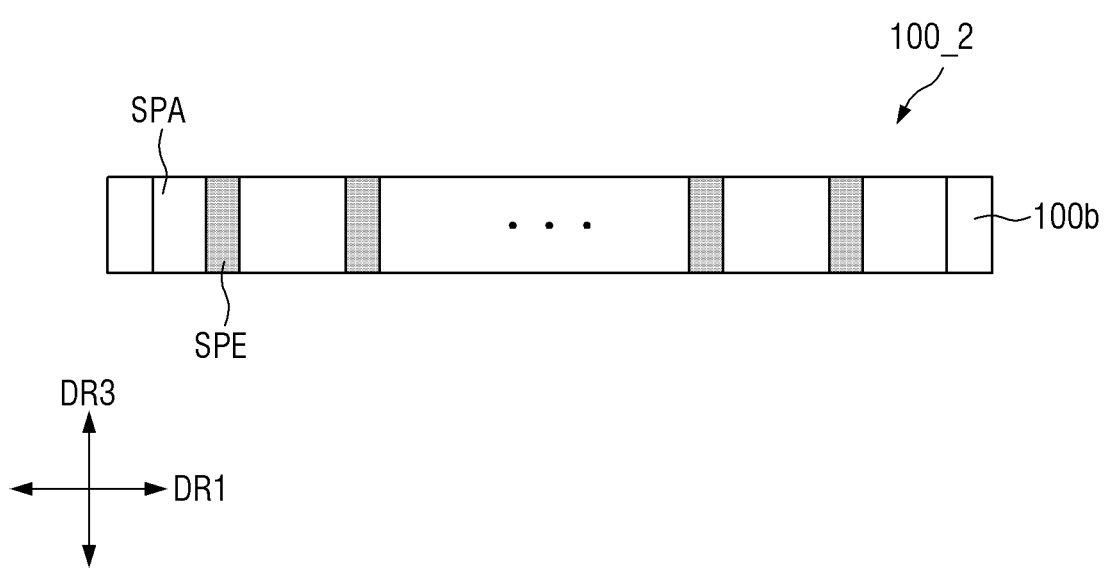
FIG. 15 is a schematic side view of the first substrate shown in FIG. 14.

FIG. 14 is a schematic perspective view illustrating a pad area and a side wiring area of a first substrate of a display device according to still another embodiment of the disclosure. FIG. 15 is a schematic side view of the first substrate shown in FIG. 14.

Referring to FIGS. 14 and 15, a first substrate 100_2 of a display device according to the embodiment differs from the first substrate 100 of FIG. 3 at least in that the first substrate 100_2 does not include a second pad area PA2 and a side wiring area SPA is disposed in an area that corresponds to the second pad area PA2.

For example, the side wiring area SPA may be disposed between a first pad area PA1 and a third pad area PA3 and connect the first pad area PA1 to the third pad area PA3.

As shown in FIGS. 3 to 6, the first pad PE1 is disposed in the first pad area PA1 and the third pad area PA3, and may not be disposed in the side wiring area SPA. A second pad PE2 may be disposed in the first pad area PA1 and the third pad area PA3, and may not be disposed in the side wiring area SPA. A connection portion CP may be disposed in the first pad area PA1 and the third pad area PA3, and may not be disposed in the side wiring area SPA.

The first pad PE1 may include a first-first pad PE1a located in the first pad area PA1 and a first-third pad PE1c located in the third pad area PA3. A side wiring SPE may be disposed between the first-first pad PE1a and the first-third pad PE1c. An end of the side wiring SPE may be electrically connected to the first-first pad PE1a and another end of the side wiring SPE may be electrically connected to the first-third pad PE1c. For example, the first-first pad PE1a and the side wiring SPE may be electrically connected (e.g., directly connected) to each other, and the side wiring SPE and the first-third pad PE1c may be electrically connected (e.g., directly connected) to each other. Further, the second pad PE2 may include a second-first pad PE2a located in the first pad area PA1 and a second-second pad PE2b located in the third pad area PA3.

According to embodiments of the disclosure, the display device and the tiled display device may prevent or reduce delamination of the driving pad caused by the test pad.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed:
1. A display device comprising:
 a substrate comprising:
  a display area comprising pixels;
  a pad area comprising a plurality of pads and located adjacent to the display area; and
  a side wiring area located adjacent to the pad area; and
 a printed circuit film attached to the pad area located on a back surface of the substrate, wherein
 the plurality of pads comprise:
  a plurality of first pads that electrically connect the printed circuit film to the pixels; and
  at least one second pad disposed between adjacent ones of the plurality of first pads,
 the display device further comprises at least one connection portion that electrically connects a first pad of the plurality of first pads and the at least one second pad to each other,
 each of the plurality of first pads comprises:
  a first-first pad located on a front surface of the substrate; and
  a first-second pad located on the back surface of the substrate, and
 the display device further comprises side wirings that are disposed in the side wiring area and electrically connect the first-first pad and the first-second pad to each other.

2. The display device of claim 1, wherein
 the pad area comprises:
  a first pad area located on the front surface of the substrate; and
  a second pad area located on the back surface of the substrate, and
 the side wiring area is disposed on a side surface between the front surface of the substrate and the back surface of the substrate.

3. The display device of claim 2, wherein
 the first-first pad is disposed in the first pad area, and
 the first-second pad is disposed in the second pad area.

4. The display device of claim 3, wherein the printed circuit film is attached onto
 the second pad area through an anisotropic conductive film.

5. The display device of claim 3, wherein
 the at least one second pad is disposed in the first pad area and the second pad area, and
 the at least one second pad is not disposed in the side wiring area.

6. The display device of claim 5, wherein
 the at least one connection portion is disposed in the first pad area and the second pad area, and
 the at least one connection portion is not disposed in the side wiring area.

7. The display device of claim 6, wherein
 the at least one second pad includes a plurality of second pads, and
 the at least one connection portion includes a plurality of connection portions.

8. The display device of claim 7, wherein the at least one second pad and the at least one connection portion are electrically connected to an adjacent first pad of the plurality of first pads in a plan view.

9. The display device of claim 6, wherein the at least one second pad comprises a plurality of patterns separated from each other.

10. The display device of claim 9, wherein the plurality of patterns of the at least one second pad are electrically connected to the first pad of the plurality of first pads via the at least one connection portion.

11. The display device of claim 10, wherein
 each of the plurality of first pads comprises:

a first lower pad portion; and
a first upper pad portion on the first lower pad portion, and
the first lower pad portion is directly connected to the at least one connection portion.

12. The display device of claim 11, wherein
the plurality of patterns of the at least one second pad comprises:
a second lower pad portion; and
a second upper pad portion on the second lower pad portion, and
the second lower pad portion is directly connected to the at least one connection portion.

13. The display device of claim 12, wherein the first lower pad portion and the second lower pad portion are disposed on a same layer.

14. The display device of claim 13, wherein the first upper pad portion and the second upper pad portion are disposed on a same layer.

15. A display device comprising:
a first substrate comprising:
a display area comprising pixels;
a pad area comprising a plurality of pads and located adjacent to the display area; and
a side wiring area located adjacent to the pad area;
a second substrate opposite to the first substrate; and
a printed circuit film attached to the pad area located on a back surface of the first substrate, wherein
the plurality of pads comprise:
a plurality of first pads that electrically connect the printed circuit film to the pixels; and
at least one second pad disposed between adjacent ones of the plurality of first pads and comprising a plurality of patterns,
the display device further comprises at least one connection portion that electrically connects one first pad of the plurality of first pads and the plurality of patterns of the at least one second pad to each other,
each of the plurality of first pads comprises:
a first-first pad located on a front surface of the first substrate; and
a first-second pad located on the back surface of the first substrate, and
the display device further comprises side wirings that are disposed in the side wiring area and electrically connect the first-first pad and the first-second pad to each other.

16. The display device of claim 15, wherein
the pad area comprises:
a first pad area located on the front surface of the first substrate; and
a second pad area located on the back surface of the first substrate, and
the first pads are disposed in the first pad area and the second pad area.

17. The display device of claim 16, wherein
the at least one second pad is disposed in the first pad area and the second pad area, and
the at least one connection portion is disposed in the first pad area and the second pad area.

18. The display device of claim 17, wherein
the at least one second pad includes a plurality of second pads,
the at least one connection portion includes a plurality of connection portions, and
the plurality of second pads and the plurality of connection portions are respectively and electrically connected to an adjacent first pad of the plurality first pads.

19. A tiled display device comprising:
a plurality of first substrates each comprising:
a display area comprising pixels;
a pad area comprising a plurality of pads and located adjacent to the display area; and
a side wiring area comprising side wirings and located adjacent to the pad area; and
a printed circuit film attached to the pad area located on a back surface of each of the plurality of first substrates, wherein
each of the plurality of first substrates comprises:
a base substrate;
a first conductive layer comprising a connection portion on the base substrate;
an insulating layer on the first conductive layer;
a second conductive layer comprising:
a first lower pad portion on the insulating layer; and
a second lower pad portion; and
a third conductive layer comprising:
a first upper pad portion overlapping the first lower pad portion on the second conductive layer in a plan view; and
a second upper pad portion overlapping the second lower pad portion in a plan view,
the plurality of pads comprise:
a plurality of first pads that electrically connect the printed circuit film to the pixels; and
a second pad disposed between adjacent ones of the plurality of first pads, each of the first pads comprises:
a first-first pad located on a front surface of the plurality of first substrates; and
a first-second pad located on the back surface of the plurality of first substrates,
the side wirings electrically connect the first-first pad and the first-second pad to each other,
the first lower pad portion and the first upper pad portion form the first-first pad, and
the second lower pad portion and the second upper pad portion form the second pad.

20. The tiled display device of claim 19, wherein
the pad area comprises:
a first pad area located on the front surface of the plurality of first substrates; and
a second pad area located on the back surface of the plurality of first substrates, and
the side wiring area connects the first pad area and the second pad area to each other.

* * * * *